United States Patent
Kobayashi et al.

(10) Patent No.: US 6,358,804 B2
(45) Date of Patent: Mar. 19, 2002

(54) SEMICONDUCTOR DEVICE AND METHOD FOR THE FABRICATION THEREOF

(75) Inventors: Akihiko Kobayashi; Katsutoshi Mine; Takashi Nakamura; Motoshi Sasaki; Kiyotaka Sawa, all of Chiba Prefecture (JP)

(73) Assignee: Dow Corning Toray Silicone Co., Ltd., Tokyo (JP)

( * ) Notice: Subject to any disclaimer, the term of this patent is extended or adjusted under 35 U.S.C. 154(b) by 0 days.

(21) Appl. No.: 09/739,610

(22) Filed: Dec. 19, 2000

Related U.S. Application Data

(62) Division of application No. 09/086,031, filed on May 28, 1998, now Pat. No. 6,214,748.

(30) Foreign Application Priority Data

May 28, 1997 (JP) .............................. 9-138860
Oct. 30, 1997 (JP) .............................. 9-298592

(51) Int. Cl.⁷ .......................................... H01L 21/336
(52) U.S. Cl. ..................... 438/301; 438/778; 438/780; 438/781; 438/782
(58) Field of Search ................... 438/301, 782, 438/778, 781, 780

(56) References Cited

U.S. PATENT DOCUMENTS

| | | | |
|---|---|---|---|
| 4,756,977 A | 7/1988 | Haluska et al. | 428/704 |
| 5,238,787 A | 8/1993 | Haluska et al. | 430/325 |
| 5,494,859 A | 2/1996 | Kapoor | 437/235 |
| 5,527,737 A | 6/1996 | Jeng | 437/195 |
| 5,548,159 A | 8/1996 | Jeng | 257/634 |
| 5,561,318 A | 10/1996 | Gnade et al. | 257/638 |
| 5,609,925 A | 3/1997 | Camilletti et al. | 427/503 |
| 5,728,630 A | 3/1998 | Nishimura et al. | 438/763 |
| 6,214,748 B1 * | 4/2001 | Kobayashi et al. | 438/782 |

FOREIGN PATENT DOCUMENTS

EP  0 462 715 A1  12/1991  ......... H01L/21/312

* cited by examiner

Primary Examiner—Richard Elms
Assistant Examiner—Pho Luu
(74) Attorney, Agent, or Firm—Sharon K. Severance

(57) ABSTRACT

A method for forming thin films on substrates wherein the films are produced by applying a solution of an electrically insulating, heat-curing resin onto the substrate, evaporating the solvent and exposing the resin to high energy radiation to cure the resin. The resin solution contains a substance selected from solvents and gas generating additives that causes the dedensification of the film during the cure of the resin. This results in a film having a dielectric constant of below 2.7. A semiconductor device is also disclosed as having an interconnect structure including at least one electrically conductive layer with an interposed insulating layer having a dielectric constant of less than 2.7 wherein the insulating layer is produced by the method described above.

9 Claims, 1 Drawing Sheet

Figure 1
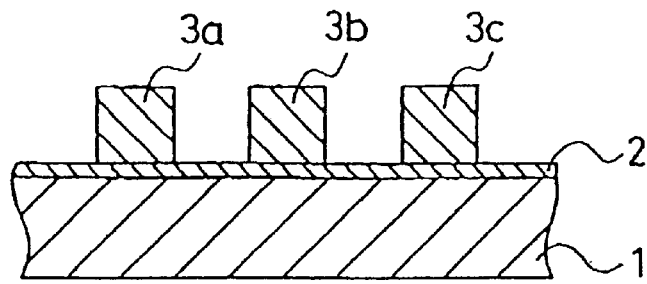
Figure 1 (a)
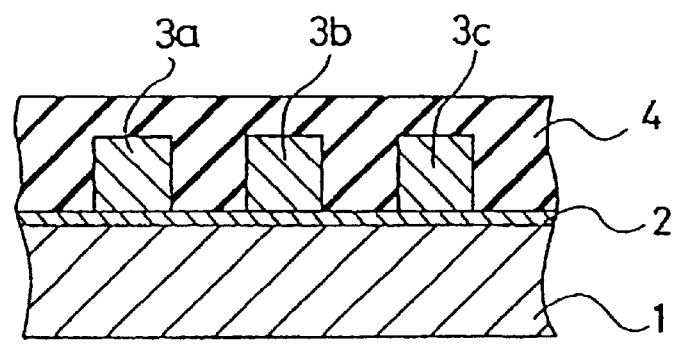
Figure 1 (b)
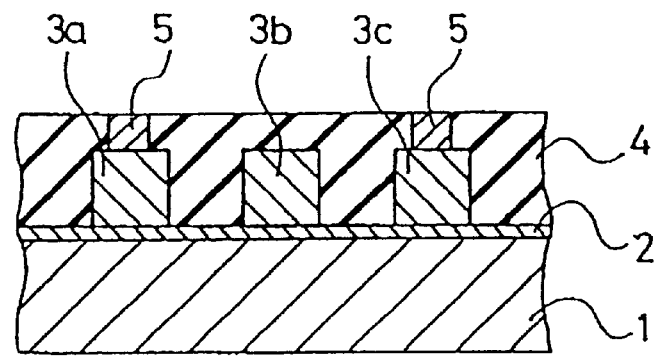
Figure 1 (c)
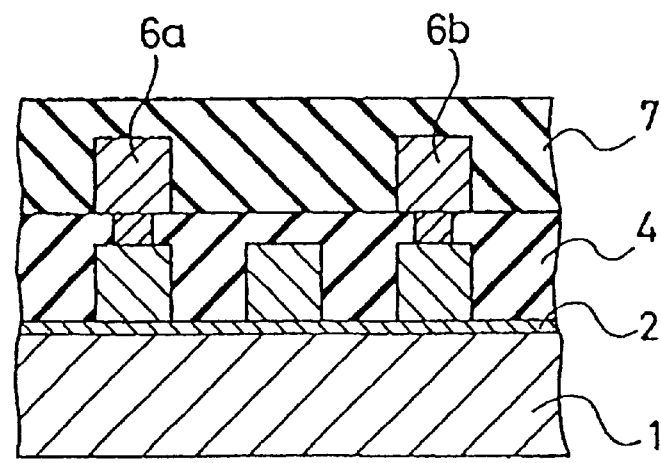
Figure 1 (d)

SEMICONDUCTOR DEVICE AND METHOD FOR THE FABRICATION THEREOF

This application is a divisional of U.S. patent application Ser. No. 09/086,031, filed May 28, 1998, now U.S. Pat. No. 6,214,748.

FIELD OF THE INVENTION

This invention pertains to a process for the formation of electrically insulating films having low dielectric constants and to semiconductor devices that have an interconnect structure comprising at least one electrically conductive layer with an interposed insulating layer. The invention also relates to methods for the fabrication of semiconductor devices of this type.

BACKGROUND OF THE INVENTION

The increasing miniaturization of semiconductor elements (the increasingly high degree of integration of semiconductor devices) has led to the use of multilevel interconnect structures on semiconductor substrates. In order to reduce parasitic capacitance between conductors, material consisting mainly of silicon oxide is generally used for the insulating layers in such semiconductor devices.

Insulating thins films of silica are known for use as protective layers and as insulating layers in electronic devices. The use of wet-coating compositions to form the layers is generally well known. For example, U.S. Pat. No. 4,756,977 teaches a process for coating electronic devices with a silica thin film by applying a solvent solution of hydrogen silsesquioxane resin on a substrate, evaporating the solvent, and then heating at temperatures of 150° C. to 1000° C. to effect conversion into ceramic like silica.

It is also known that the dielectric constant of the insulating thin film can be reduced by executing the insulating thin film itself as a porous structure. For example, U.S. Pat. No. 5,548,159 has described the formation of an insulating thin film with a porous structure through the use of the baked product of hydrogen silsesquioxane resin as the dielectric layer in a highly integrated circuit. This patent, however, does not disclose a specific method for the formation of the porous structure.

Because the miniaturization of semiconductor elements leads to increasingly small interconnect gaps and increasingly high aspect ratios between interconnects, large film thicknesses and an excellent capacity to fill between interconnects are required of the insulating layers. Highly integrated circuits with interconnect gaps declining below 0.18 $\mu$m have been designed for semiconductor devices in recent years. While highly integrated circuits of this type require that the dielectric constant of the insulating layers be brought below 2.7, even insulating layers formed from hydrogen silsequioxane resin have been unable to achieve such dielectric constants.

An object of this invention is to provide a process for forming insulating thin films that have a low dielectric constant.

A further object of this invention is to provide semiconductor devices having low dielectric constant insulating layers therein and to the method for the fabrication thereof.

SUMMARY OF THE INVENTION

This invention pertains to a method for forming electrically insulating thin films wherein the method comprises coating the surface of a substrate with a composition comprising (A) a resin selected from the group consisting of electrically insulating, heat-curing organic resins and electrically insulating, heat-curing inorganic resins; and (B) a solvent capable of dissolving resin (A) and (C) a solvent whose boiling point or vapor pressure curve or affinity for resin (A) differs from that of solvent (B);

evaporating at least a portion of the solvents (B) and (C); and subsequently exposing the substrate to high energy radiation and inducing evaporation of the remaining solvents during the course of or after the cure of resin (A).

This invention also pertains to a method for forming electrically insulating thin films wherein the method comprises coating the surface of a substrate with a composition comprising (A) a resin selected from the group consisting of electrically insulating, heat-curing organic resins and electrically insulating, heat-curing inorganic resins; and (B) a solvent capable of dissolving the resin (A); and (D) a substance that is soluble in solvent (B) and that can generate gas in the temperature range of from 0° C. to 800° C. by heating or by interaction with resin (A);

evaporating the solvent (B); and subsequently exposing the substrate to high energy radiation and inducing the generation of gas from the substance (D) during the course of or after the cure of the resin (A).

The processes of this invention results in a porosification or dedensification of the thin film and reduction in the dielectric constant to below 2.7. This makes possible an adequate attenuation in the parasitic capacitance between interconnects for semiconductor devices in which an interconnect structure comprising at least one electrically conductive layer is provided on the surface of a semiconductor substrate with separation by an interposed electrically insulating layer—even in the case of highly integrated circuits in which the interconnect gap is narrower than 0.18 $\mu$m.

BRIEF DESCRIPTION OF THE DRAWINGS

FIG. 1 is a cross-sectional diagram that shows the various processes in the fabrication of a semiconductor device that is an exemplary embodiment of the present invention.

DETAILED DESCRIPTION OF THE INVENTION

The inorganic or organic resin (A) used in the present invention is not critical as long as it is solvent soluble, can be cured by heating after its application, and provides insulation. Resin (A) can be exemplified by inorganic resins such as silica precursor resins, for example, hydrogen silsesquioxane resin, the partial hydrolyzates of alkoxysilanes, and others; and by organic resins such as polyimide resins, fluorocarbon resins, benzocyclobutene resins, and fluorinated polyallyl ethers. Resin (A) can take the form of a single resin or a mixture of two or more resins. Silica precursor resins (with their capacity to cure into silica) are preferred for their ability to provide particularly good insulating properties. Among the silica precursor resins, hydrogen silsesquioxane resins, which can be used in a non-etchback process, are particularly preferred.

The hydrogen silsesquioxane resin is a polysiloxane whose main skeleton is composed of the trifunctional siloxane unit $HSiO_{3/2}$ and is a polymer with the general formula $(HSiO_{3/2})_n$ in which the subscript n is an integer. Hydrogen silsesquioxane resins can be categorized based on their molecular structure into ladder-type polysiloxanes and cage-type polysiloxanes. The terminals of the ladder-type polysiloxanes can be endblocked by, for example, the hydroxyl group, a triorganosiloxy group such as the trimethylsiloxy group, or a diorganohydrogensiloxy group such as the dimethylhydrogensiloxy group. Hydrogen silsesquioxane resin can be synthesized, for example, by the hydrolysis of trichlorosilane and ensuing polycondensation (see U.S. Pat. No. 3,615,272 and Japanese Patent Applications Laid Open (Kokai or Unexamined) Numbers Sho 59-189126 (189,126/1984) and Sho 60-42426 (42,426/1985)).

Solvent (B) should be capable of dissolving resin (A) without the occurrence of chemical changes, but is not otherwise critical. Solvents usable as the solvent (B) are exemplified by aromatic solvents such as toluene, xylene, and others; aliphatic solvents such as hexane, heptane, octane, and others; ketone solvents such as methyl ethyl ketone, methyl isobutyl ketone, and others; aliphatic ester solvents such as butyl acetate, isoamyl acetate, and others; and silicone solvents such as chain methylsiloxanes like hexamethyldisiloxane and 1,1,3,3-tetramethyldisiloxane, cyclic siloxanes like 1,1,3,3,5,5,7,7-octamethyltetracyclosiloxane and 1,3,5,7-tetramethyltetracyclosiloxane, and silanes such as tetramethylsilane and dimethyldiethylsilane. Methyl isobutyl ketone and the silicone solvents are preferred.

Solvent (C) is solvent that has at least one characteristic selected from the boiling point, vapor-pressure curve, and affinity for the resin that differs from the corresponding characteristic of the solvent (B). A solvent with a boiling point higher than that of the solvent (B) is preferred. Solvent (C) is exemplified by (the value in parentheses is the boiling point): hydrocarbon solvents such as amylbenzene (202° C.), isopropylbenzene (152° C.), 1,2-diethylbenzene (183° C.), 1,3-diethylbenzene (181° C.), 1,4-diethylbenzene (184° C.), cyclohexylbenzene (239° C.), dipentene (177° C.), 2,6-dimethylnaphthalene (262° C.), p-cymene (177° C.), camphor oil (160–185° C.), solvent naphtha (110–200° C.), cis-decalin (196° C.), trans-decalin (187° C.), decane (174° C.), tetralin (207° C.), turpentine oil (153–175° C.), kerosene (200–245° C.), dodecane (216° C.), branched dodecylbenzene, and others; ketone and aldehyde solvents such as acetophenone (201.7° C.), isophorone (215.3° C.), phorone (198–199° C.), methylcyclohexanone (169.0–170.5° C.), methyl n-heptyl ketone (195.3° C.), and others; ester solvents such as diethyl phthalate (296.1° C.), benzyl acetate (215.5° C.), γ-butyrolactone (204° C.), dibutyl oxalate (240° C.), 2-ethylhexyl acetate (198.6° C.), ethyl benzoate (213.2° C.), benzyl formate (203° C.), and others; sulfur-containing compound solvents such as diethyl sulfate (208° C.), sulfolane (285° C.), and others; halohydrocarbon solvents; alcohol solvents; etherified hydrocarbon solvents; carboxylic anhydride solvents; phenolic solvents; and silicone solvents.

In the case of the insulating thin film-forming composition in which resin (A) is dissolved in solvents (B) and (C), the solvents (B) and (C) are not simply employed as solvents for the resin. Rather, the solvents (B) and (C) are also gasified and expelled from the system during or after resin cure, thereby leaving voids or free spaces in the insulating thin film and as a result generating a low dielectric constant insulating thin film. A major fraction of the main solvent (B) will evaporate immediately after coating on the substrate, but a portion will remain in the film and this residual component functions to form voids. However, in order to efficiently lower the dielectric constant, solvent (C) must be added in addition to the solvent (B). Solvent (C) is one or a mixture of 2 or more solvents that have a higher boiling point than the solvent (B), or that have a different vapor-pressure curve from that of the solvent (B), i.e., that are more difficult to evaporate, or that have a different affinity for the resin from that of the solvent (B). Solvent (C) remains in larger amounts in the film immediately after the composition has been coated on the substrate and will also be evaporated and expelled from the system during or after resin cure. Solvent (C) is not crucial, but it should be selected with a view to obtaining an optimal relationship with the curing temperature of the resin.

Additive (D), which is a source of gas generation, is one or a mixture of two or more substances that are soluble in solvent (B) and that can generate gas in the temperature range from 0° C. to 800° C. by heating or by interaction with the resin. "Gas generation" refers to the generation of gas by volatilization, the generation of gas by an autonomous decomposition reaction, and the release of gas by chemical reaction with the resin.

In the case of the insulating thin film-forming composition in which resin (A) is dissolved along with the substance (D) in the solvent (B), through heating or by interaction with the resin the substance (D) generates gas, preferably also with expulsion from the system, during or after resin cure. The effect of this gas generation, preferably also with expulsion from the system, is to leave voids or free spaces in the insulating thin film and thereby lower the dielectric constant of the insulating thin film. The temperature at which gas is generated from the substance (D) must be compatible with the process for forming insulating thin films and will be in the range from 0° C. to 800° C. and is preferably from 25° C. to 400° C. Since in a preferred embodiment a majority of the solvent (B) evaporates immediately after coating on the substrate and gas generation from the substance (D) occurs subsequent to this, the onset temperature for gas generation from substance (D) is preferably higher than the boiling point of the solvent (B).

Additives (D) that generate gas by volatilization are exemplified by, but not limited to, organic solids such as biphenyl, naphthalene, anthracene, and the like, and by oils such as silicone oils and the like. When hydrogen silsesquioxane resin is used as the resin, silicone is preferred based on compatibility considerations.

Additives (D) that generate gas by their own decomposition are exemplified by, but not limited to, organic peroxides such as benzoyl peroxide and the like.

Additives (D) that generate gas by interaction with the resin can be exemplified by amines, for example, N,N,N',N'-tetramethyl-1,6-hexanediamine, when the resin contains SiH, in which case hydrogen gas is generated.

The resin coated on the substrate is cured by exposure to high energy radiation such as electron beam, ultraviolet radiation, x-rays, and others. A single type of radiation can be used or several types of radiation can be used in combination. The use of exposure to high energy radiation permits resin cure to be induced while restraining the temperature to low levels.

The ability to induce resin cure at low temperatures through the use of exposure to high energy radiation as described above permits use as the resin of low molecular weight hydrogen silsesquioxane resin with a molecular weight ≦1,500. Low molecular weight hydrogen silsesquioxane resin of this type offers the advantages of an excellent capacity to coat and planarize the substrate and an excellent capacity to fill in and embed topographical variations on the substrate caused, for example, by interconnects. At the same time, however, exposure to high temperatures causes resin of this type to scatter out, resulting in contamination of surrounding equipment and a diminution in film thickness. As a consequence, it has been necessary in the case of thermal curing, for example, in an oven, to preliminarily remove the low molecular weight component from hydrogen silsesquioxane resin. However, the use of exposure to high energy radiation permits the use of low molecular weight hydrogen silsesquioxane resin.

The atmosphere for the resin curing reaction is also not critical, and, in addition to nitrogen and oxygen atmospheres, the curing reaction may be run in special atmospheres such as water vapor, ammonia, nitrogen monoxide, and ozone.

When the high energy radiation takes the form of the electron beam, exposure can be carried out at ambient pressure or at reduced pressure. In the case of irradiation at ambient temperature, the atmosphere is not critical and exposure can be carried out under the atmospheres already described above. In the case of irradiation at reduced pressure, the degree of the vacuum is again not critical and irradiation can be carried out at any pressure ranging from ultrahigh vacuums to vacuums near ambient pressure. In addition, when exposure is carried out under reduced pressure and in particular when the specimen is held at reduced pressure immediately after exposure under a high vacuum, the dangling bonds that have been produced in the insulating thin film can be preserved. Under these circumstances, the admission of any of various gases to the specimen with a drop in the degree of vacuum makes possible bonding or substitution of the dangling bonds with the gas molecules and hence the utilization of post-irradiation reactions for film formation.

The crosslinking arising from the curing reaction can be, for example, crosslinking based on the condensation reaction of silicon-bonded hydrogen, crosslinking based on the addition reaction between silicon-bonded hydrogen and silicon-bonded vinyl groups, and crosslinking based on the condensation reaction of alkoxy groups and silanol groups as seen in the known types of inorganic and organic SOGs. Taking these into consideration, the composition for forming insulating thin films may contain an appropriately selected additive for the purpose of accelerating the curing reaction induced by the high energy radiation. The cure accelerator can be, for example, a platinum-containing compound such as chloroplatinic acid hexahydrate and should be selected as appropriate as a function of the type of high energy radiation.

The thin films produced by the method of this invention may be used in the fabrication of semiconductor devices. As shown in FIG. 1(a), fabrication commences with the formation of a base insulating layer 2 on a semiconductor substrate 1 (silicon wafer) on the surface of which a semiconductor element (not shown) has been formed. This can be done by laying down, for example, a BPSG film over the entire surface of the semiconductor substrate 1 and reflowing this film. An electrically conductive layer is then formed by sputtering a metal, for example, aluminum, on the base insulating layer 2. Lower level interconnects 3a, 3b, and 3c are thereafter formed by patterning the conductive layer by known methods.

As shown in FIG. 1(b), an insulating layer 4 is subsequently formed by coating, for example, by spin coating, the entire surface of the semiconductor substrate 1 with the thin film forming composition and subsequently curing the resin by exposure to high energy radiation. During this process, the generation of gas is induced within the insulating layer 4 during the course of or after resin cure, and this gas generation causes a dedensification of the insulating layer 4. This dedensification occurs as the development of porosity in the insulating layer 4 or as an increase in the free space in the insulating layer 4.

As shown in FIG. 1(c), through holes 5 that reach, for example, to the lower level interconnects 3a and 3c, are then provided by masking with a photoresist and selectively etching the insulating layer 4 that overlies, respectively, the lower level interconnects 3a and 3c. A conductive layer is then formed over the entire surface by sputtering a metal, for example, aluminum. This is followed by etchback by plasma etching until exposure of the insulating layer 4, which leaves interlevel interconnects within the through holes 5.

As shown in FIG. 1(d), the upper level interconnects 6a and 6b and the insulating layer 7 are then formed on the etchbacked surface by the same methods as used to provide the lower level interconnects 3a to 3c and insulating layer 4. The preceding steps result in the formation of a multilevel interconnect structure of lower level interconnects 3a to 3c and upper level interconnects 6a and 6b on the semiconductor substrate 1 wherein the interconnects are electrically insulated by the base insulating layer 2 and the interlayer insulating layers 4 and 7. The fabrication method described hereinabove makes it possible to bring the dielectric constant of the dedensified insulating layer 4 to below 2.7.

In order to reduce the dielectric constant of the insulating layer to below 2.7, it is necessary in the present invention to lower the density of the insulating layer by increasing the porosity or free space. However, the development of this porous character must not be accompanied by negative influences on the film strength, dielectric breakdown, adherence, or moisture absorption. As a consequence, the resin of the insulating layer is preferably hydrogen silsesquioxane resin, which is a silicon dioxide precursor.

After the resin solution has been coated on the semiconductor substrate and the solvent has been removed, the resin may be melted in order to fill in topographical variations on the semiconductor substrate and planarize depressions and elevations in the insulating layer. In this case, a resin is preferably used that has a melting point or softening point.

When the resin solution does not contain additive (D), gas generation after the beginning of resin cure will be brought about by the solvent. When the resin solution contains additive (D), gas generation after the beginning of resin cure will be brought about by the additive or solvent. In either case, gas generation must occur after the beginning of resin cure. When the gas generation process occurs with the resin in uncured form, problems will develop such as cracking in the ultimately obtained insulating layer and a failure to obtain an insulating layer with the desired thickness due to dissolution by the resin.

In order to cause gas generation after initiation of resin cure, chemical stabilization of the solvent or additive at the cure initiation temperature can be achieved by establishing a high temperature for the initiation of gas generation and/or establishing a low temperature for the initiation of resin cure. The gas generation preferably occurs after a moderate cure but prior to complete cure. The occurrence of gas generation prior to complete cure permits an effective development of porosity in the insulating layer.

The gas generation may be carried out at reduced pressure. The execution of gas generation at reduced pressure can accelerate gas generation. In addition to conducting gas generation by heating, it may also be carried out with the impression of ultrasound or microwaves (e.g., electromagnetic radiation). The execution of gas generation by the impression of microwaves makes it possible to lower the treatment temperatures in the overall fabrication process. After gas generation, resin cure can be developed further by heating or exposure to high energy radiation. The treatment temperature in this process can be reduced through the use of high energy radiation.

The gas generation can be, for example, volatilization (simple gasification); gasification reactions such as decomposition reactions and chemical reactions (also including reactions with the resin); sublimation; and gasification after liquefaction of a solid. Additives (D) that undergo gasification or decomposition and leave no residues in the system after gas generation are preferred since they will have no negative influences on the semiconductor device.

The dielectric constant of the insulating layer can be brought below 2.7 by coating the semiconductor substrate with a solution of organic resin and/or inorganic resin dissolved in solvent and forming the insulating layer by curing the said resin by exposure to high energy radiation while dedensifying the insulating layer through the generation of gas within the insulating layer after the beginning of resin cure. This makes possible an adequate attenuation in the parasitic capacitance between interconnects in semiconductor devices in which an interconnect structure comprising at least one electrically conductive layer is provided on a semiconductor substrate with separation by an interposed electrically insulating layer—even in the case of highly integrated circuits in which the interconnect gap is narrower than 0.18 μm.

EXAMPLES

So that those skilled in the art can understand and appreciate the invention taught herein, the following examples are presented, it being understood that these examples should not be used to limit the scope of this invention found in the claims.

The conversion to silica was evaluated by measuring the % residual Si—H bond in the insulating layer by Fourier transform-infrared absorption spectroscopy (the value immediately after spin coating was used as 100%).

The dielectric constant was measured at 25° C./1 MHz on a sample formed on a silicon wafer with a resistivity of $10^{-2}$ Ω-cm. The measurement was run using an impedance analyzer on the capacitance between interconnects by the sandwich method with aluminum electrodes.

Semiconductor devices having an aluminum multilevel interconnect structure (interconnect pattern with a feature height of 0.5 μm and a feature width and feature interval of 0.18 μm each) base coated with a CVD film were used in Examples 1–7 and Comparative Examples 1 and 2.

Example 1

Molecular weight fractionation was run on hydrogen silsesquioxane resin with a number-average molecular weight of 1,540 and a weight-average molecular weight of 7,705 (component with molecular weight≦1,500=41%, softening point=90° C.) to give a fraction with a number-average molecular weight of 5,830 and a weight-average molecular weight of 11,200 (softening point=180° C.). This h-resin fraction was dissolved in methyl isobutyl ketone to give a solution containing 18 weight % solids. To this solution was added cyclohexylbenzene at 1 weight % based on the weight of the solution.

The hydrogen silsesquioxane resin solution was spin coated on the semiconductor device using a preliminary rotation of 500 rpm for 3 seconds and then a main rotation of 5,000 rpm for 10 seconds. After the solvent was thoroughly evaporated, standing for 10 minutes at room temperature gave a film with a thickness of 8,010 angstroms in its deepest section. Using an electron beam irradiator with an acceleration voltage of 165 kV, the wafer was exposed to an electron beam at a dose of 80 Mrad under a current of nitrogen that contained 70 ppm oxygen. At this point the insulating layer was less soluble in methyl isobutyl ketone than immediately after spin coating.

The wafer was annealed for 1 hour at 400° C. in a quartz furnace under a nitrogen current that contained 10 ppm oxygen, withdrawn, and held for 10 minutes at room temperature. The residual Si—H bond content in the insulating layer formed on the wafer was 74%, which confirmed that 26% of the hydrogen silsesquioxane resin had converted to silica. In addition, no abnormalities, such as cracking, etc., were observed in the insulating layer after conversion.

After the formation of a CVD film on the insulating layer, a multilevel interconnect structure was elaborated by the via hole contact technique. The dielectric constant of the insulating layer in the resulting semiconductor device was 2.5, and no abnormalities in electrical characteristics were observed.

Example 2

The h-resin fraction described in Example 1 was dissolved in methyl isobutyl ketone to give a solution containing 18 weight % solids. To this solution was added cyclohexylbenzene at 10 weight % based on the weight of the solution.

Using the method described in Example 1 the hydrogen silsesquioxane resin solution was spin coated on the semiconductor device resulting in a film with a thickness of 8,020 angstroms in its deepest section. The wafer was exposed to electron beam and annealed as in Example 1. The residual Si—H bond content in the insulating layer formed on the wafer was 73%, which confirmed that 27% of the hydrogen silsesquioxane resin had converted to silica. In addition, no abnormalities, such as cracking, etc., were observed in the insulating layer after conversion.

After the formation of a CVD film on the insulating layer, a multilevel interconnect structure was elaborated by the via hole contact technique. The dielectric constant of the insulating layer in the resulting semiconductor device was 2.4, and no abnormalities in electrical characteristics were observed.

Example 3

The h-resin fraction described in Example 1 was dissolved in methyl isobutyl ketone to give a solution containing 20 weight % solids. To this solution was added cyclohexylbenzene at 10 weight % based on the weight of the solution.

Using the method described in Example 1 the hydrogen silsesquioxane resin solution was spin coated on the semiconductor device except that the main rotation was 4,500 rpm for 10 seconds resulting in a film with a thickness of 13,200 angstroms in its deepest section. The wafer was exposed to electron beam and annealed as in Example 1. The residual Si—H bond content in the insulating layer formed on the wafer was 74%, which confirmed that 26% of the hydrogen silsesquioxane resin had converted to silica. In addition, no abnormalities, such as cracking, etc., were observed in the insulating layer after conversion.

After the formation of a CVD film on the insulating layer, a multilevel interconnect structure was elaborated by the via hole contact technique. The dielectric constant of the insulating layer in the resulting semiconductor device was 2.4, and no abnormalities in electrical characteristics were observed.

Example 4

The h-resin fraction described in Example 1 was dissolved in methyl isobutyl ketone to give a solution containing 18 weight % solids. To this solution was added amylbenzene at 10 weight % based on the weight of the solution.

Using the method described in Example 1 the hydrogen silsesquioxane resin solution was spin coated on the semiconductor device resulting in a film with a thickness of 8,000 angstroms in its deepest section. The wafer was exposed to electron beam and annealed as in Example 1. The residual Si—H bond content in the insulating layer formed on the wafer was 74%, which confirmed that 26% of the hydrogen silsesquioxane resin had converted to silica. In addition, no abnormalities, such as cracking, etc., were observed in the insulating layer after conversion.

After the formation of a CVD film on the insulating layer, a multilevel interconnect structure was elaborated by the via hole contact technique. The dielectric constant of the insulating layer in the resulting semiconductor device was 2.4, and no abnormalities in electrical characteristics were observed.

Example 5

The h-resin fraction described in Example 1 was dissolved in methyl isobutyl ketone to give a solution containing 18 weight % solids. To this solution was added biphenyl at 10 weight % based on the weight of the solution.

Using the method described in Example 1 the hydrogen silsesquioxane resin solution was spin coated on the semiconductor device resulting in a film with a thickness of 8,015 angstroms in its deepest section. The wafer was exposed to electron beam and annealed as in Example 1. The residual Si—H bond content in the insulating layer formed on the wafer was 74%, which confirmed that 26% of the hydrogen silsesquioxane resin had converted to silica. In addition, no abnormalities, such as cracking, etc., were observed in the insulating layer after conversion.

After the formation of a CVD film on the insulating layer, a multilevel interconnect structure was elaborated by the via hole contact technique. The dielectric constant of the insulating layer in the resulting semiconductor device was 2.4, and no abnormalities in electrical characteristics were observed.

Example 6

Molecular weight fractionation was performed on a hydrogen silsesquioxane resin with a number-average molecular weight of 1,540, a weight-average molecular weight of 7,705, and a softening point of 90° C. to give a h-resin fraction with a number-average molecular weight of 743, a weight-average molecular weight of 1,613, and a softening point of 25° C. This h-resin fraction was dissolved in a mixed solvent of hexamethyldisiloxane/octamethyltrisiloxane (30/70 weight %) to give a solution containing 25 weight % solids. To this solution was added cyclohexylbenzene at 10 weight % based on the weight of the solution.

Using the method described in Example 1 the hydrogen silsesquioxane resin solution was spin coated on the semiconductor device except that the main rotation was 3,000 rpm for 10 seconds resulting in a film with a thickness of 8,015 angstroms in its deepest section. The wafer was exposed to electron beam and annealed as in Example 1 except that the electron beam was at a dose of 160 Mrad. The residual Si—H bond content in the insulating layer formed on the wafer was 72%, which confirmed that 28% of the hydrogen silsesquioxane resin had converted to silica. In addition, no abnormalities, such as cracking, etc., were observed in the insulating layer after conversion.

After the formation of a CVD film on the insulating layer, a multilevel interconnect structure was elaborated by the via hole contact technique. The dielectric constant of the insulating layer in the resulting semiconductor device was 2.2, and no abnormalities in electrical characteristics were observed.

Example 7

10 weight % cyclohexylbenzene was added to an organic spin-on-glass (OCD-TYPE7 from Tokyo Oyo Kagaku Kogyo Kabushiki Kaisha) that was a precursor for silicon dioxide.

Using the method described in Example 1 the organic-spin-on-glass solution was spin coated on the semiconductor device resulting in a film with a thickness of 7,520 angstroms in its deepest section. The wafer was exposed to electron beam and annealed as in Example 1. It was confirmed at this point that conversion to silica had occurred. In addition, no abnormalities, such as cracking, etc., were observed in the insulating layer after conversion.

After the formation of a CVD film on the insulating layer, a multilevel interconnect structure was elaborated by the via hole contact technique. The dielectric constant of the insulating layer in the resulting semiconductor device was 2.6, and no abnormalities in electrical characteristics were observed.

Comparative Example 1

The h-resin fraction described in Example 1 was dissolved in methyl isobutyl ketone to prepare a solution containing 18 weight % solids.

Using the method described in Example 1 the hydrogen silsesquioxane resin solution was spin coated on the semiconductor device resulting in a film with a thickness of 8,015 angstroms in its deepest section. The wafer was annealed for 1 hour at 400° C. in a quartz furnace under a nitrogen current that contained 10 ppm oxygen, withdrawn, and held for 10 minutes at room temperature. The residual Si—H bond content in the insulating layer formed on the wafer was 75%, which confirmed that 25% of the hydrogen silsesquioxane resin had converted to silica. In addition, no abnormalities, such as cracking, etc., were observed in the insulating layer after conversion.

After the formation of a CVD film on the insulating layer, a multilevel interconnect structure was elaborated by the via hole contact technique. The dielectric constant of the insulating layer in the resulting semiconductor device was 2.8, and no abnormalities in electrical characteristics were observed.

Comparative Example 2

The h-resin fraction described in Example 1 was dissolved in methyl isobutyl ketone to prepare a solution containing 20 weight % solids.

Using the method described in Example 1 the hydrogen silsesquioxane resin solution was spin coated on the semiconductor device except that the main rotation was 4,500 rpm for 10 seconds resulting in a film with a thickness of 13,100 angstroms in its deepest section. The wafer was annealed for 1 hour at 400° C. in a quartz furnace under a nitrogen current that contained 10 ppm oxygen, withdrawn, and held for 10 minutes at room temperature. The residual Si—H bond content in the insulating layer formed on the wafer was 75%, which confirmed that 25% of the hydrogen silsesquioxane resin had converted to silica. In this case, the post-conversion insulating layer suffered from a substantial decline in film thickness and cracking was observed in the insulating layer.

After the formation of a CVD film on the insulating layer, a multilevel interconnect structure was elaborated by the via hole contact technique. The dielectric constant of the insulating layer in the resulting semiconductor device was 2.8. Electrical contact defects were observed in parts of the device.

Example 8

Hydrogen silsesquioxane resin was synthesized by the method described in Example 1 (page 3) of Japanese Patent Publication (Kokoku) Number Sho 47-31838 (U.S. Pat. No. 3,615,272). Analysis of the hydrogen silsesquioxane resin product by gel permeation chromatography (GPC) gave a number-average molecular weight of 1,540 and a weight-average molecular weight of 7,705. The hydrogen silsesquioxane resin was subjected to a molecular weight fractionation according to the method described in Example 1 (page 5) of Japanese Patent Application Laid Open (Kokai or Unexamined) Number Hei 6-157760 (157,760/1994) (U.S. Pat. No. 5,416,190). Analysis of the hydrogen silsesquioxane resin in the recovered fraction ("h-resin fraction") by GPC gave a number-average molecular weight of 5,830 and a weight-average molecular weight of 11,200. The conditions in the GPC measurements are reported below.

instrument: 802A from the Tosoh Corporation
    column: G3000/G4000/G5000/G6000
    carrier solvent: toluene
    column temperature: 30° C.
    molecular weight standard: polystyrene
    detection: differential refractometer
    sample: 2 weight % solids (toluene solution)

The h-resin fraction was dissolved in methyl isobutyl ketone to prepare the 22 weight % (solids) solution. To this solution was added cyclohexylbenzene at 1 weight % based on the weight of the solution. A film with a thickness of 6,040 angstroms was produced by spin coating the solution on a silicon wafer at a preliminary rotation of 500 rpm for 3 seconds and then at a main rotation of 3,000 rpm for 10 seconds followed by standing for 10 minutes at room temperature. Using an electron beam irradiator with an acceleration voltage of 165 kV, the wafer was exposed to an electron beam at a dose of 80 Mrad under nitrogen that contained 70 ppm oxygen. At this point the film was less soluble in methyl isobutyl ketone than immediately after spin coating.

The wafer was annealed for 1 hour at 400° C. in a quartz furnace under a nitrogen current that contained 10 ppm oxygen, withdrawn, and held for 10 minutes at room temperature. The residual Si—H bond content in the resulting insulating film was 74%, which confirmed conversion of the hydrogen silsesquioxane resin to silica. In addition, no abnormalities, such as cracking, etc., were observed in the insulating film. The dielectric constant of this insulating film was 2.4.

Example 9

The h-resin fraction prepared in Example 8 was dissolved in methyl isobutyl ketone to prepare a 22 weight % (solids) solution. To this solution was added cyclohexylbenzene at 10 weight % based on the weight of the solution. A film with a thickness of 6,270 angstroms was produced by the coating method described in Example 8. The wafer was then exposed to electron beam radiation and annealed as in Example 8. The residual Si—H bond content in the resulting insulating film was 74%, which confirmed conversion of the hydrogen silsesquioxane resin to silica. In addition, no abnormalities, such as cracking, etc., were observed in the insulating film. The dielectric constant of this insulating film was 2.4.

Example 10

The h-resin fraction prepared in Example 8 was dissolved in methyl isobutyl ketone to prepare a 35 weight % (solids) solution. To this solution was added cyclohexylbenzene at 10 weight % based on the weight of the solution. A film with a thickness of 13,500 angstroms was produced by the coating method described in Example 8 except that the main rotation was 2,000 rpm for 10 seconds. The wafer was then exposed to electron beam radiation and annealed as in Example 8. The residual Si—H bond content in the resulting insulating film was 74%, which confirmed conversion of the hydrogen silsesquioxane resin to silica. In addition, no abnormalities, such as cracking, etc., were observed in the insulating film. The dielectric constant of this insulating film was 2.4.

Example 11

The h-resin fraction prepared in Example 8 was dissolved in methyl isobutyl ketone to prepare a 22 weight % (solids) solution. To this solution was added amylbenzene at 10 weight % based on the weight of the solution. A film with a thickness of 6,150 angstroms was produced by the coating method described in Example 8. The wafer was then exposed to electron beam radiation and annealed as in Example 8. The residual Si—H bond content in the resulting insulating film was 74%, which confirmed conversion of the hydrogen silsesquioxane resin to silica. In addition, no abnormalities, such as cracking, etc., were observed in the insulating film. The dielectric constant of this insulating film was 2.4.

Example 12

The h-resin fraction prepared in Example 8 was dissolved in methyl isobutyl ketone to prepare a 22 weight % (solids) solution. To this solution was added biphenyl at 10 weight % based on the weight of the solution. A film with a thickness of 6,200 angstroms was produced by the coating method described in Example 8. The wafer was then exposed to electron beam radiation and annealed as in Example 8. The residual Si—H bond content in the resulting insulating film was 74%, which confirmed conversion of the hydrogen silsesquioxane resin to silica. In addition, no abnormalities, such as cracking, etc., were observed in the insulating film. The dielectric constant of this insulating film was 2.4.

Example 13

The h-resin fraction prepared in Example 8 was dissolved in methyl isobutyl ketone to prepare a 22 weight % (solids) solution. To this solution was added N,N,N',N'-tetramethyl- 1,6-hexanediamine at 10 weight-ppm based on the weight of the solution. A film with a thickness of 6,100 angstroms was produced by the coating method described in Example 8. The wafer was then exposed to electron beam radiation and annealed as in Example 8. The residual Si—H bond content in the resulting insulating film was 32%, which confirmed conversion of the hydrogen silsesquioxane resin to silica. In addition, no abnormalities, such as cracking, etc., were observed in the insulating film. The dielectric constant of this insulating film was 2.4.

Example 14

The h-resin fraction prepared in Example 8 was dissolved in methyl isobutyl ketone to prepare a 22 weight % (solids) solution. To this solution was added benzoyl peroxide at 50 weight-ppm based on the weight of the solution. A film with a thickness of 6,250 angstroms was produced by the coating method described in Example 8. The wafer was then exposed to electron beam radiation and annealed as in Example 8. The residual Si—H bond content in the resulting insulating film was 35%, which confirmed conversion of the hydrogen silsesquioxane resin to silica. In addition, no abnormalities, such as cracking, etc., were observed in the insulating film. The dielectric constant of this insulating film was 2.4.

Example 15

Hydrogen silsesquioxane resin was synthesized by the method described in Example 1 (page 3) of Japanese Patent Publication (Kokoku) Number Sho 47-31838 (U.S. Pat. No. 3,615,272). Analysis of the hydrogen silsesquioxane resin product by GPC gave a number-average molecular weight of 1,540, a weight-average molecular weight of 7,705, and a value of 41 weight % for the content of component with a molecular weight no greater than 1,500. The hydrogen silsesquioxane resin was subjected to a molecular weight fractionation according to the method described in Example 1 (page 5) of Japanese Patent Application Laid Open (Kokai or Unexamined) Number Hei 6-157760 (U.S. Pat. No. 5,416,190). Analysis of the hydrogen silsesquioxane resin in the recovered fraction ("h-resin fraction") by GPC gave a number-average molecular weight of 743, a weight-average molecular weight of 1,613, and a value of 72 weight % for the content of component with a molecular weight no greater than 1,500. The conditions in the GPC measurements were the same as reported in Example 8.

This h-resin fraction was dissolved in hexamethyldisiloxane/octamethyltrisiloxane mixed solvent (30/70) to prepare the 30 weight % (solids) solution. To this solution was added cyclohexylbenzene at 10 weight % based on the weight of the solution. A film with a thickness of 6,350 angstroms was produced by the coating method described in Example 8. The wafer was then exposed to electron beam radiation and annealed as in Example 8. The residual Si—H bond content in the insulating film was 72%, which confirmed conversion of the hydrogen silsesquioxane resin to silica. In addition, no abnormalities, such as cracking, etc., were observed in the insulating film. The dielectric constant of this insulating film was 2.2.

Example 16

10 weight % cyclohexylbenzene was added to an organic spin-on glass (brand name: OCD-TYPE7 from Tokyo Oyo Kagaku Kogyo Kabushiki Kaisha). A film with a thickness of 6,200 angstroms was formed by the coating method described in Example 8. The wafer was then exposed to electron beam radiation and annealed as in Example 8. No abnormalities, such as cracking, etc., were observed in the resulting insulating film. The dielectric constant of this insulating film was 2.7.

Example 17

Hydrogen silsesquioxane resin (number-average molecular weight=1,540 and weight-average molecular weight=7,705) synthesized according to the method described in Example 1 (page 3) of Japanese Patent Publication (Kokoku) Number Sho 47-31838 (U.S. Pat. No. 3,615,272) was dissolved in methyl isobutyl ketone to prepare the 26 weight % (solids) solution. To this solution was added cyclohexylbenzene at 10 weight % based on the weight of the solution. A film with a thickness of 6,100 angstroms was prepared by the coating method described in Example 8. The wafer was then exposed to electron beam radiation and annealed as in Example 8. The residual Si—H bond content in the insulating film was 72%, which confirmed conversion of the hydrogen silsesquioxane resin to silica. In addition, no abnormalities, such as cracking, etc., were observed in the insulating film. The dielectric constant of this insulating film was 2.4.

Example 18

The h-resin fraction described in Example 8 was dissolved in methyl isobutyl ketone to prepare 22 weight % (solids) solution. To this solution was added cyclohexylbenzene at 10 weight % and polyoxyethylene lauryl ether at 1 weight %, in each case based on the weight of the solution. A film with a thickness of 6,350 angstroms was produced by the coating method described in Example 8. The wafer was then exposed to electron beam radiation and annealed as in Example 8. The residual Si—H bond content in the insulating film was 73%, which confirmed conversion of the hydrogen silsesquioxane resin to silica. In addition, no abnormalities, such as cracking, etc., were observed in the insulating film. The dielectric constant of this insulating film was 2.4.

Example 19

The h-resin fraction described in Example 8 was dissolved in methyl isobutyl ketone to prepare a 18 weight % (solids) solution. To this solution was added cyclohexylbenzene at 10 weight % based on the weight of the solution. A film with a thickness of 8,310 angstroms at its deepest section was produced by spin coating the resulting solution on a polysilicon wafer (feature height=0.5 $\mu$m, feature width and feature spacing=0.18 $\mu$m) at a preliminary rotation of 500 rpm for 3 seconds and then a main rotation of 5,000 rpm for 10 seconds and subsequently holding for 10 minutes at room temperature. The wafer was heated under a nitrogen current on a hot plate using the sequence of 150° C./1 minute, 200° C./1 minute, and 250° C./1 minute in the order given. This resulted in fluidization with thorough gapfilling between the features and thorough planarization of the resin surface. Using an electron beam irradiator with an acceleration voltage of 165 kV, the wafer was exposed to an electron beam at a dose of 80 Mrad under nitrogen that contained 70 ppm oxygen. At this point the film was less soluble in methyl isobutyl ketone than immediately after spin coating. The wafer was annealed for 1 hour at 400° C. in a quartz furnace under a nitrogen current that contained 10 ppm oxygen, withdrawn, and held for 10 minutes at room temperature. No abnormalities, such as cracking, etc., were observed in the resulting insulating film.

Example 20

A fluorinated polyallyl ether resin was synthesized according to the method described on page 116 of the 1995 Proceedings of the Twelfth International VLSI Multilevel Interconnection Conference. Analysis of the resin product by GPC gave a number-average molecular weight of 2,540 and a weight-average molecular weight of 9,390. This resin was dissolved in methyl isobutyl ketone to prepare the 26 weight % (solids) solution. To this solution was added cyclohexylbenzene at 10 weight % based on the weight of the solution. A film with a thickness of 6,070 angstroms was produced by the coating method described in Example 8. The wafer was then exposed to electron beam radiation and annealed as in Example 8. This resulted in an additional decline in the solubility of the insulating film. In addition, no abnormalities, such as cracking, etc., were observed in the insulating film. The dielectric constant of this insulating film was 2.4.

Example 21

The h-resin fraction prepared in Example 8 was dissolved in methyl isobutyl ketone to prepare a 22 weight % (solids) solution. To this solution was added cyclohexylbenzene at 10 weight % based on the weight of the solution. A film with a thickness of 6,270 angstroms was produced by the coating method described in Example 8. Using an electron beam irradiator with an acceleration voltage of 8 kV, the wafer was exposed for 10 seconds to 5 $mC/cm^2$ of radiation under a vacuum of $10^{-6}$ torr. The specimen was withdrawn from the vacuum, placed in air at ordinary atmospheric pressure, and held for 10 minutes. At this point the film was less soluble in methyl isobutyl ketone than immediately after spin coating.

The wafer was annealed for 1 hour at 400° C. in a quartz furnace under a nitrogen current that contained 10 ppm oxygen, withdrawn, and held for 10 minutes at room temperature. The residual Si—H bond content in the resulting insulating film was 75%, which confirmed conversion of the hydrogen silsesquioxane resin to silica. In addition, no abnormalities, such as cracking, etc., were observed in the insulating film. The dielectric constant of this insulating film was 2.4.

Example 22

The h-resin fraction prepared in Example 8 was dissolved in methyl isobutyl ketone to prepare a 22 weight % (solids) solution. To this solution was added cyclohexylbenzene at 10 weight % based on the weight of the solution. A film with a thickness of 6,310 angstroms was produced by the coating method described in Example 8. The wafer was exposed for 10 minutes to ultraviolet radiation with an intensity of 160 W/cm from a high-pressure mercury lamp in air that contained 10 ppm ozone. At this point the film was less soluble in methyl isobutyl ketone than immediately after spin coating.

The wafer was annealed for 1 hour at 400° C. in a quartz furnace under a nitrogen current that contained 10 ppm oxygen, withdrawn, and held for 10 minutes at room temperature. The residual Si—H bond content in the resulting insulating film was 71%, which confirmed conversion of the hydrogen silsesquioxane resin to silica. In addition, no abnormalities, such as cracking, etc., were observed in the insulating film. The dielectric constant of this insulating film was 2.4.

Example 23

The h-resin fraction prepared in Example 8 was dissolved in methyl isobutyl ketone to prepare a 22 weight % (solids) solution. To this solution was added cyclohexylbenzene at 10 weight % based on the weight of the solution. A film with a thickness of 6,280 angstroms was produced by the coating method described in Example 8. While residing on a hot plate heated to 250° C., the wafer was exposed for 10 minutes to ultraviolet radiation with an intensity of 160 W/cm from a high-pressure mercury lamp in air that contained 10 ppm ozone. At this point the film was less soluble in methyl isobutyl ketone than immediately after spin coating.

The wafer was annealed for 1 hour at 400° C. in a quartz furnace under a nitrogen current that contained 10 ppm oxygen, withdrawn, and held for 10 minutes at room temperature. The residual Si—H bond content in the resulting insulating film was 70%, which confirmed conversion of the hydrogen silsesquioxane resin to silica. In addition, no abnormalities, such as cracking, etc., were observed in the insulating film. The dielectric constant of this insulating film was 2.4.

Comparative Example 3

The h-resin fraction described in Example 8 was dissolved in methyl isobutyl ketone to prepare a 22 weight % (solids) solution. A film with a thickness of 6,070 angstroms was produced by the coating method described in Example 8. The wafer was annealed for 1 hour at 400° C. in a quartz oven under a current of nitrogen containing 10 ppm oxygen, then withdrawn and held for 10 minutes at room temperature. The residual SiH % in the resulting insulating film was 75%, which confirmed that conversion of the hydrogen silsesquioxane resin to silica had occurred. The production of cracks in the insulating film was also observed. The dielectric constant of this insulating film was 2.8.

Comparative Example 4

The h-resin fraction described in Example 8 was dissolved in methyl isobutyl ketone to prepare a 35 weight % (solids) solution. A film with a thickness of 13,200 angstroms was produced by spin coating the resulting solution on a silicon wafer at a preliminary rotation of 500 rpm for 3 seconds and then at a main rotation of 2,000 rpm for 10 seconds followed by standing for 10 minutes at room temperature. The wafer was annealed for 1 hour at 400° C. in a quartz oven under a current of nitrogen containing 10 ppm oxygen, then withdrawn and held for 10 minutes at room temperature. The residual SiH % in the resulting insulating film was 75%, which confirmed that conversion of the hydrogen silsesquioxane resin to silica had occurred. Cracks had also been produced in the insulating film. The dielectric constant of this insulating film was 2.8.

Comparative Example 5

The h-resin fraction prepared in Example 8 was dissolved in methyl isobutyl ketone to prepare a 22 weight % (solids) solution. A film with a thickness of 6,040 angstroms was produced by the coating method described in Example 8. The wafer was then exposed to electron beam radiation and annealed as in Example 8. The residual Si—H bond content in the insulating film formed on the wafer was 69%, which confirmed conversion of the hydrogen silsesquioxane resin to silica. In addition, no abnormalities, such as cracking, etc., were observed in the insulating film. The dielectric constant of this insulating film was 2.8.

TABLE 1

|  | film thickness in angstroms | | | | refractive index | | | residual SiH % |
| --- | --- | --- | --- | --- | --- | --- | --- | --- |
|  | after coating | after low-temp. cure | after annealing | dielectric constant | after coating | after low-temp. cure | after annealing | (degree of film cure) |
| Example 8 | 6040 | 6000 | 6020 | 2.4 | 1.406 | 1.404 | 1.363 | 74 |
| Example 9 | 6270 | 6190 | 6210 | 2.4 | 1.409 | 1.417 | 1.365 | 73 |
| Example 10 | 13500 | 13330 | 13400 | 2.4 | 1.409 | 1.417 | 1.361 | 74 |
| Example 11 | 6150 | 6100 | 6110 | 2.4 | 1.415 | 1.420 | 1.361 | 74 |
| Example 12 | 6200 | 6150 | 6170 | 2.4 | 1.420 | 1.425 | 1.365 | 74 |
| Example 13 | 6100 | 6205 | 6205 | 2.4 | 1.393 | 1.400 | 1.369 | 32 |
| Example 14 | 6250 | 6240 | 6190 | 2.4 | 1.393 | 1.392 | 1.364 | 35 |
| Example 15 | 6350 | 5920 | 5850 | 2.2 | 1.403 | 1.400 | 1.360 | 72 |
| Example 16 | 6200 | 6150 | 6120 | 2.7 | 1.410 | 1.411 | 1.369 | — |
| Example 17 | 6100 | 5950 | 5900 | 2.4 | 1.411 | 1.405 | 1.364 | 72 |
| Example 18 | 6350 | 6300 | 6210 | 2.4 | 1.412 | 1.407 | 1.369 | 73 |
| Example 19 | 8310 | 8275 | 8240 | — | — | — | — | — |
| Example 20 | 6070 | 6050 | 6060 | 2.4 | 1.410 | 1.408 | 1.365 | — |
| Example 21 | 6270 | 6200 | 6230 | 2.4 | 1.411 | 1.407 | 1.366 | 75 |
| Example 22 | 6310 | 6250 | 6210 | 2.4 | 1.409 | 1.407 | 1.366 | 71 |
| Example 23 | 6280 | 6100 | 6050 | 2.4 | 1.410 | 1.401 | 1.368 | 70 |
| Comp. Ex. 3 | 6070 | 6120 | 6270 | 2.8 | 1.400 | — | 1.372 | 75 |
| Comp. Ex. 4 | 13300 | 13200 | 13350 | 2.8 | 1.392 | — | 1.372 | 75 |
| Comp. Ex. 5 | 6040 | 5990 | 6050 | 2.8 | 1.392 | 1.392 | 1.379 | 69 |

What is claimed is:

1. A method for forming electrically insulating thin films wherein the method comprises coating the surface of a substrate with a composition comprising
   (A) a resin selected from the group consisting of electrically insulating, heat-curing organic resins and electrically insulating, heat-curing inorganic resins; and
   (B) a solvent capable of dissolving resin (A) and
   (C) a solvent selected from the group consisting of a solvent whose boiling point differs from solvent (B), a solvent whose vapor pressure curve differs from that of solvent (B) and a solvent whose affinity for resin (A) differs from that of solvent (B) and wherein the solvent (C) is selected from the group consisting of hydrocarbon solvents; ketone solvents; aldehyde solvents; ester solvents; diethyl sulfate; sulfolane; halohydrocarbon solvents; etherified hydrocarbon solvents; alcohol solvents; ether solvents; acetal solvents; polyhydric alcohol solvents; carboxylic anhydride solvents; and phenolic solvents;
evaporating at least a portion of the solvents (B) and (C); and subsequently exposing the substrate to high energy radiation and inducing evaporation of the remaining solvents during the course of or after the cure of resin (A).

2. The method as claimed in claim 1 wherein the substrate is an electronic device.

3. The method as claimed in claim 1 wherein the coating of the surface is by spin coating.

4. The method as claimed in claim 1 wherein the high energy radiation is electron beam.

5. The method as claimed in claim 1 wherein resin (A) is hydrogen silsesquioxane resin.

6. The method as claimed in claim 1 wherein solvent (B) is selected from the group consisting of aromatic solvents, aliphatic solvents; ketone solvents, aliphatic ester solvents, silicone solvents, and silanes.

7. The method as claimed in claim 1 wherein solvent (C) cyclohexylbenzene.

8. The method as claimed in claim 1 wherein solvent (C) is amylbenzene.

9. A method for forming electrically insulating thin films wherein the method comprises coating the surface of a substrate with a composition comprising
   (A) a resin selected from the group consisting of electrically insulating, heat-curing organic resins and electrically insulating, heat-curing inorganic resins; and
   (B) a solvent capable of dissolving resin (A) and
   (C) a solvent selected from the group consisting of a solvent whose boiling point is higher than solvent (B), a solvent whose vapor pressure curve differs from that of solvent (B) and a solvent whose affinity for resin (A) differs from that of solvent (B) and wherein the solvent (C) is selected from the group consisting of hydrocarbon solvents; ketone solvents; aldehyde solvents; ester solvents; diethyl sulfate; sulfolane; halohydrocarbon solvents; etherified hydrocarbon solvents; alcohol solvents; ether solvents; acetal solvents; polyhydric alcohol solvents; carboxylic anhydride solvents; and phenolic solvents;
evaporating at least a portion of the solvents (B) and (C); and subsequently exposing the substrate to high energy radiation and inducing evaporation of the remaining solvents during the course of or after the cure of resin (A).

* * * * *